United States Patent
Shiga

(10) Patent No.: US 8,304,902 B2
(45) Date of Patent: Nov. 6, 2012

(54) SEMICONDUCTOR DEVICE

(75) Inventor: Toshitaka Shiga, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 130 days.

(21) Appl. No.: 12/826,228

(22) Filed: Jun. 29, 2010

(65) Prior Publication Data

US 2011/0233760 A1   Sep. 29, 2011

(30) Foreign Application Priority Data

Mar. 23, 2010   (JP) ................................. 2010-066512

(51) Int. Cl.
*H01L 23/48* (2006.01)

(52) U.S. Cl. .......................... 257/735; 257/707; 257/713

(58) Field of Classification Search .................. 257/707, 257/713, 735
See application file for complete search history.

(56) References Cited

U.S. PATENT DOCUMENTS

| | | | |
|---|---|---|---|
| 5,313,095 A | 5/1994 | Tagawa et al. | |
| 5,663,597 A | 9/1997 | Nelson et al. | |
| 2004/0227547 A1* | 11/2004 | Shiraishi et al. | 327/110 |
| 2009/0179323 A1* | 7/2009 | Feng et al. | 257/712 |

FOREIGN PATENT DOCUMENTS

| | | |
|---|---|---|
| JP | 5-299576 A | 11/1993 |
| JP | 6-283658 A | 10/1994 |
| JP | 10-200023 A | 7/1998 |
| JP | 10-261755 A | 9/1998 |
| JP | 2001-110980 A | 4/2001 |
| JP | 2001-320009 A | 11/2001 |
| JP | 2001-358288 | 12/2001 |
| JP | 2002-373965 A | 12/2002 |
| JP | 2003-174142 | 6/2003 |
| JP | 2005-12085 | 1/2005 |
| JP | 2008-125315 A | 5/2008 |
| JP | 2008-171940 | 7/2008 |
| WO | WO 2004/064110 A2 | 7/2004 |

* cited by examiner

*Primary Examiner* — Steven Loke
*Assistant Examiner* — Kimberly M Thomas
(74) *Attorney, Agent, or Firm* — Birch, Stewart, Kolasch & Birch, LLP

(57) ABSTRACT

A power semiconductor chip (first semiconductor chip) 41 is mounted on the main surface of a first radiator plate 31, and a control IC chip (second semiconductor chip) 42 is mounted on the main surface of a second radiator plate 32. The first radiator plate 31 has an extending portion 31A extending toward the side on which the second radiator plate 32 is provided in the arrangement direction of first lead terminals (lead terminals 21 to 24). The first lead terminals (lead terminals 21 to 24) are connected to a first side of the first radiator plate 31 to function as extraction electrodes of a rear side electrode (D: drain electrode) of the power semiconductor chip 41. A second lead terminal (lead terminal 25) is connected to a bonding pad 411 serving as a source electrode (S). The third lead terminals (lead terminals 26 to 28) are connected to an electrode of the control IC chip 42.

3 Claims, 3 Drawing Sheets

SEMICONDUCTOR DEVICE

BACKGROUND OF THE INVENTION

1. Field of the Invention

The present invention relates to a structure of a semiconductor device incorporating, as one package, a power semiconductor chip that performs a large-current operation and a control semiconductor chip controlling the power semiconductor chip mounted together on a lead frame.

2. Description of the Related Art

A power semiconductor element (rectification diode, power MOSFET, IGBT, etc.) that performs large current switching or large current rectification generates a large amount of heat during operation. Thus, it is desirable for a power semiconductor module incorporating such a power semiconductor element in a mold material to have a high heat dissipation efficiency.

Such a configured power semiconductor module is disclosed in, e.g., Patent Document 1 (Japanese Patent No. 3,250,213). In such a power semiconductor module, a lead frame constituted by a radiator plate and lead terminals (leads) is used, and a power semiconductor chip is mounted on the radiator plate. This structure is sealed by a resin mold material, and the solidified mold material forms a package. The lead frame is made of copper, etc., having a high thermal conductivity. The lead terminals constituting a part of the lead frame are protruded from the mold material. Electrodes of the power semiconductor chip are connected to the respective leads constituting electric signal input/output terminals using bonding wires, etc. The power semiconductor chip operates with a voltage externally applied to each lead. In actual use of the power semiconductor module having such a configuration, the leads are inserted into through-holes formed in a printed circuit board and soldered to the printed circuit board. Alternatively, a configuration may be adopted in which not only the leads are protruded from the mold material but also the radiator plate is exposed on the rear side of the mold material. In this case, the rear-side radiator plate itself may be soldered to the printed circuit board.

The thermal conductivity of the mold material is not higher as compared to that of the lead frame. Thus, how heat generated from the power semiconductor chip is released outside through the lead frame is important in order to increase the heat dissipation efficiency. That is, heat generated from the power semiconductor chip is directly released outside through the leads led out from the mold material or through the radiator plate, or indirectly released outside through the mold material.

However, there may a case where the power semiconductor chip and a control IC chip are mixedly mounted in the power semiconductor module. In this case, heat generated from the power semiconductor chip is transferred to the control IC chip, and the temperature of the control IC is increased, which may result in performance degradation. That is, a temperature rise of the power semiconductor chip is transferred to the control IC chip, etc., which may prevent proper operation of the power semiconductor module. In Patent Document 1, the control IC chip and power semiconductor chip are mounted on a single lead frame, which is disadvantageous in terms of heat dissipation. That is, in the conventional technique as described above, heat generated from the power semiconductor chip cannot be released outside in a satisfactory manner but the temperature rise of the control IC chip, etc., occurs, making it difficult to obtain a high-reliable power semiconductor module. Further, since a terminal for outputting a high voltage from the power semiconductor chip and a terminal for outputting a low voltage from the control IC chip are arranged in parallel, a problem remains in terms of voltage resistance.

This results in difficulty in obtaining a high-reliable semiconductor device having an improved heat dissipation property.

SUMMARY OF THE INVENTION

The present invention has been made in view of the above problems, and an object thereof is to provide an invention that solves the above problems.

To solve the above problems, the present invention is configured as follows.

A semiconductor device according to the present invention includes: a first radiator plate; a second radiator plate disposed separately away from the first radiator plate; a plurality of first lead terminals arranged on a first side of the first radiator plate; a second lead terminal arranged on a second side of the first radiator plate that is opposite to the first side; third lead terminals arranged on the second side and located closer to the second radiator plate than the second lead terminal; a first semiconductor chip mounted on the main surface of the first radiator plate and including a pair of main electrodes; a second semiconductor chip mounted on the main surface of the second radiator plate; and a mold material covering the first radiator plate, the second radiator plate, a part of the first lead terminals, a part of the second lead terminal, a part of the third lead terminals, the first semiconductor chip, and a the second semiconductor chip. The first lead terminals, second lead terminal and third lead terminals are led out from a pair of sides of the mold material in the opposite directions to each other. The first radiator plate has an extending portion extending toward the side on which the second radiator plate is provided in the arrangement direction of the first lead terminals. At least one or more first lead terminals are connected to the first radiator plate. One main electrode of the first semiconductor chip is connected to the first lead terminals, the other main electrode of the first semiconductor chip is connected to the second lead terminal, and an electrode of the second semiconductor chip is connected to the third lead terminals.

In the semiconductor device according to the present invention, a temperature sensor is mounted on the second semiconductor chip.

In the semiconductor device according to the present invention, the first semiconductor chip has one main electrode on its rear side and the other main electrode on its upper side, the one main electrode is electrically connected to the first radiator plate, and the first lead terminals are connected to the first radiator plate to function as extraction electrodes of the one main electrode, and the highest voltage among the voltage levels applied to a circuit constituted by the first and second semiconductor chips is applied between the first lead terminals and the second lead terminal.

In the semiconductor device according to the present invention, the extending portion extends, in the direction along the first side of the first radiator plate, at least up to a position at which the side of the second semiconductor chip furthest away from the first radiator plate exists, and the extending portion and second radiator plate are arranged with a gap interposed therebetween.

In the semiconductor device according to the present invention, the first radiator plate including the extending portion has a larger thickness than those of the first lead terminals, second lead terminal, and third lead terminals.

With the above configuration, a high-reliable semiconductor device having an improved heat dissipation property can be obtained.

DETAILED DESCRIPTION OF THE PREFERRED EMBODIMENTS

A power semiconductor module will be described below as a semiconductor device according to an embodiment of the present invention. In the power semiconductor module of the embodiment, a power semiconductor chip and a control IC chip are mounted on individual radiator plates which are assembled with a plurality of lead terminals to constitute a lead frame assembly. This lead frame assembly is covered by a mold material to constitute a power semiconductor module (semiconductor device).

Figure 1:
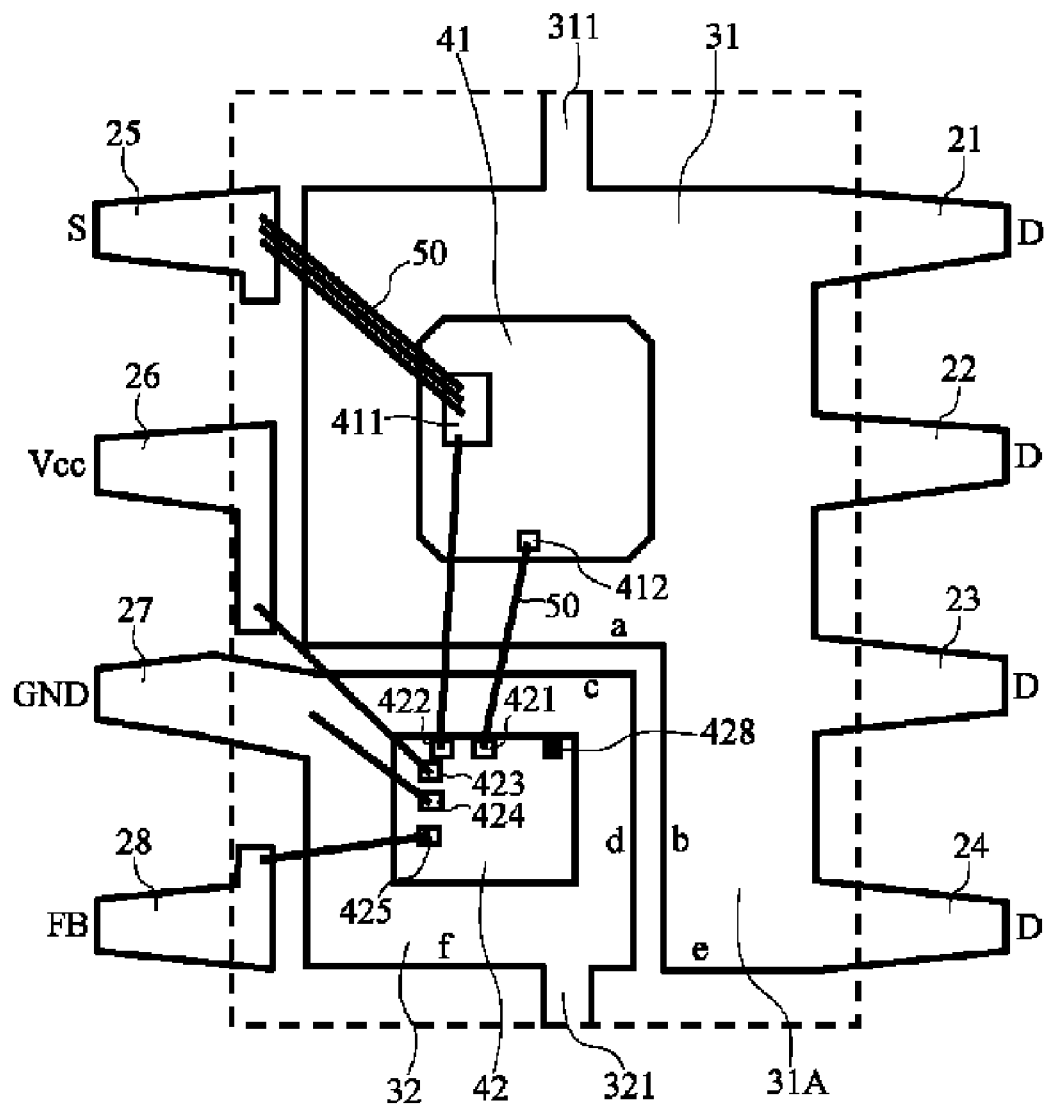
FIG. 1 is a top perspective view illustrating the configuration of a semiconductor device according to an embodiment of the present invention.

FIG. 1 is a top perspective view of this power semiconductor module (semiconductor device) 10. The area surrounded by a broken line corresponds to the mold material. Four lead terminals 21 to 24 are led out from one side of the mold material, and four lead terminals 25 to 28 are led out from the other side in the opposite direction to the terminals 21 to 24. In the power semiconductor module 10, the power semiconductor chip (first semiconductor chip) performs high-power switching operation, and control IC chip (second semiconductor chip) performs control of the power semiconductor chip.

Figure 2:
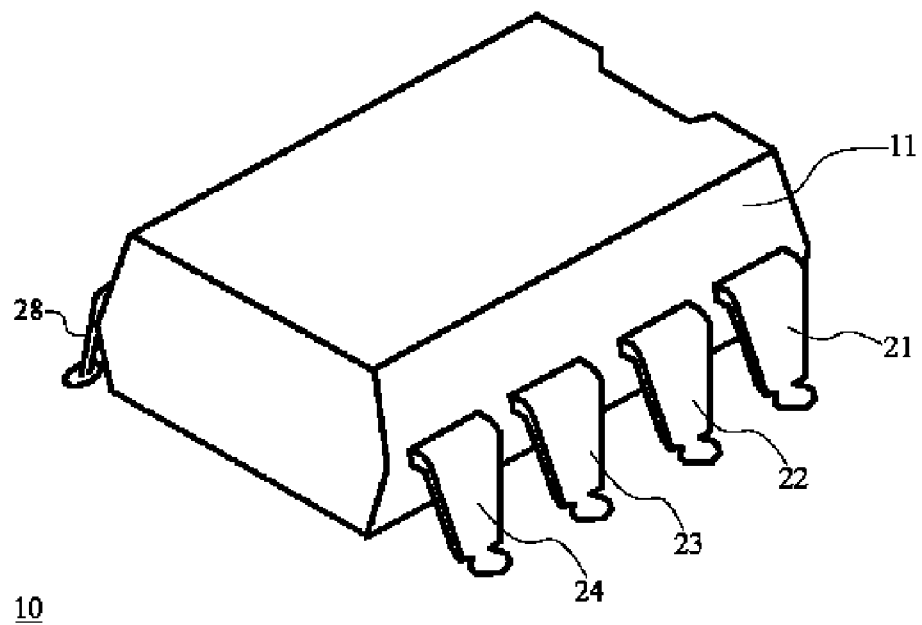
FIG. 2 is a perspective view illustrating the outer appearance of the semiconductor device according to the embodiment of the present invention.

FIG. 2 is a perspective view of the outer appearance of the power semiconductor module 10. As illustrated, in the power semiconductor module 10, the lead terminals led out from the mold material are subjected to lead forming (bending work), and the leading ends of the bent lead terminals are inserted into through-holes formed in a printed circuit board and fixed to the printed circuit board by soldering.

In the power semiconductor module 10, first and second radiator plates 31 and 32 formed separately from each other are provided. A power semiconductor chip (first semiconductor chip) 41 is mounted on the main surface of the first radiator plate 31 and a control IC chip (second semiconductor chip) 42 is mounted on the main surface of the second radiator plate 32. The power semiconductor chip 41 generates more heat than the control IC chip 42 and, in order to increase the heat dissipation effect, the area of the first radiator plate 31 is made larger than that of the second radiator plate 32. A temperature sensor 428 for measuring the temperature of the control IC chip 42 is provided in the control IC chip 42.

The lead terminals 21 to 28 are functionally classified into three terminal groups: a first lead terminal group (lead terminals 21 to 24), a second lead terminal (lead terminal 25), and a third lead terminal group (lead terminals 26 to 28).

The first radiator plate 31 has an extending portion 31A extending toward the side on which the second radiator plate 32 is provided in the arrangement direction of the first lead terminals (lead terminals 21 to 24). Thus, in FIG. 1, sides c and d defining a part of the outer periphery of the second radiator plate 32 come close to and opposite to sides a and b of the first radiator plate 31. In order to bring the temperature detected by the temperature sensor 428 close to the temperature of the power semiconductor chip 41, the interval between the sides c and a and interval between the sides d and b are preferably set to 0.15 mm to 0.9 mm, respectively.

The first and second radiator plates 31 and 32 are each made of copper, copper alloy, iron, iron alloy, aluminum, or aluminum alloy, having a thickness capable of obtaining desired mechanical strength and heat dissipation effect. The thicknesses of the first radiator plate 31, second radiator plate 32, and extending portion 31A may be made larger than those of the lead terminals 21 to 24 and 25 to 28. More specifically, the thicknesses of the first radiator plate 31, second radiator plate 32, and extending portion 31A are preferably set to 0.25 mm to 1.0 mm, and thicknesses of the lead terminals 21 to 24 and 25 to 28 are preferably set to 0.25 mm to 0.75 mm. The copper, copper alloy, iron, iron alloy, aluminum, or aluminum alloy has a thermal conductivity sufficiently higher than epoxy resin forming the mold material, so that heat generated from the power semiconductor chip 41 during operation can be released from the lead terminals through the radiator plate.

Figure 3:
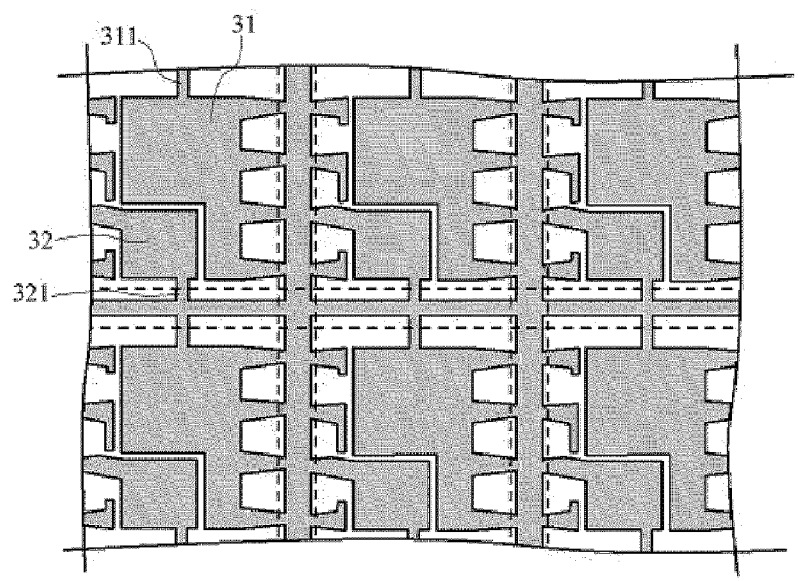
FIG. 3 is a plan view of a metal pattern for use in manufacturing the semiconductor device according to the embodiment of the present invention.

In manufacturing the power semiconductor module 10, a metal frame illustrated in FIG. 3 in which a number of radiator plate sets having the lead terminals are arranged is used. The power semiconductor chip 41, control IC chip 42, and the like are mounted on each of the radiator plate sets on the metal frame, thereby creating a state in which a plurality of lead frame assemblies are arranged. After that, the mold materials are formed at portions corresponding to respective power semiconductor modules, and the metal frame is cut at the boundary portions (portions indicated by broken lines in FIG. 3) defining a number of power semiconductor modules, whereby the power semiconductor module 10 of FIG. 1 is obtained. Although fixing bars 311 and 321 are provided for fixing the first radiator plate 31 and second radiator plate 32 in the metal frame, the fixing bars 311 and 321 are removed in the manufacturing process of the semiconductor module 10. The above manufacturing method itself is the same as a known manufacturing method of a semiconductor module having a configuration in which a semiconductor chip is mounted on the lead frame.

The power semiconductor chip (first semiconductor chip) 41 is a semiconductor element to which a high voltage is applied and through which a large current passes for its operation. Examples of the power semiconductor chip of this type include, e.g., a rectification diode, power MOSFET, and IGBT (Insulated Gate Bipolar Transistor). One main surface of the power semiconductor chip (first semiconductor chip) 41 is electrically connected to the first radiator plate 31 through an electrically-conducting adhesive (not shown), and the other main surface thereof has a plurality of bonding pads (electrodes) 411 and 412 formed thereon.

The control IC chip (second semiconductor chip) 42 is an IC having a circuit for controlling the power semiconductor chip 41. Like the power semiconductor chip 41, bonding pads 421, 422, 423, 424, and 425 are formed on the upper surface of the control IC chip 42. Further, inside the control IC chip 42, a temperature sensor (temperature sensing element) 428 is provided together with a control circuit. The temperature sensor 428 electrically senses the temperature of the power semiconductor chip 41 and outputs the sensed temperature to the control circuit. When the temperature of the power semiconductor chip 41 becomes higher than the temperature of the power semiconductor chip 41 at normal operation, the control circuit controls the operation of the power semiconductor chip 41. In the present invention, the extending portion 31A extends toward the side on which the second radiator plate 32 is provided. Thus, separating the first radiator plate 31 and second radiator plate 32 with a gap formed therebetween prevents malfunction of the control IC chip 42 due to overheating. On the other hand, the temperature sensor 428 of the control IC chip 42 is surrounded by the first radiator plate 31 (extending portion 31A) on which the power semiconductor chip 41 is mounted, so that it is possible to transfer the temperature of the power semiconductor chip 41 to the temperature sensor 428, allowing the temperature sensor 428 to reliably sense the temperature.

Electrical connections to the power semiconductor chip 41 and control IC chip 42 are made by connecting bonding wires to the bonding pads formed on the upper surface of the power semiconductor chip 41 and control IC chip 42. In FIG. 1, bonding wires 50 are used to connect between the bonding pad 411 (source electrode) of the power semiconductor chip 41 and the second lead terminal (lead terminal 25), between the bonding pad 411 of the power semiconductor chip 41 and the bonding pad 422 of the control IC chip 42, and between the bonding pad 412 (gate electrode) of the power semiconductor chip 41 and the bonding pad 421 of the control IC chip 42. Further, the bonding pads 423, 425 of the control IC chip 42 and the third lead terminals (lead terminals 26, 28) are electrically connected by the bonding wires 50. Furthermore, the bonding pad 424 of the control IC chip 42 and the second radiator plate 32 are electrically connected by the bonding wire 50. A drain electrode is formed on the rear surface (surface opposite to the surface on which the bonding pad 411 and the like are provided) of the power semiconductor chip 41 and is adhered to the upper surface of the first radiator plate 31 through an electrically-conducting adhesive.

Figure 4:
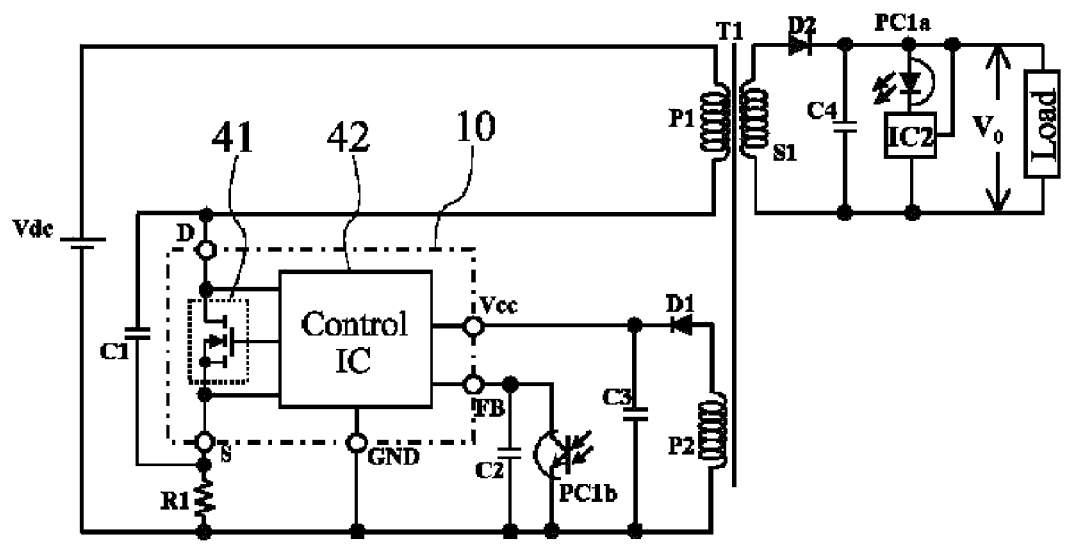
FIG. 4 is a view illustrating an example of a circuit included in the semiconductor device according to the embodiment of the present invention.

FIG. 4 illustrates an example of a power supply circuit (e.g., stand-by power supply circuit) realized by using the power semiconductor module 10. In the power semiconductor module 10 realizing the power supply circuit of FIG. 4, an operating current of the power semiconductor chip 41 flows between a drain (D) and a source (S) which are a pair of main electrodes. Thus, the highest voltage among the voltage levels applied to the power supply circuit at normal operation is applied between the D and S. The ON/OFF of the operating current is controlled by an output signal (gate signal) from the control IC chip 42. A Vcc is provided as a power supply voltage input terminal for operating the control IC chip 42, and an FB is provided as a control signal input terminal. Ultimately, an output voltage Vo is applied to a load presented in the upper right portion of FIG. 4. Thus, in the power semiconductor module 10, five terminals of D, S, Vcc, FB, and GND (ground) are required, and they are distributed as the lead terminals.

In the power semiconductor module 10, the first lead terminals (lead terminals 21 to 24) are arranged in parallel to one another along a first side (one side: right side in FIG. 1) of the first radiator plate 31. The second lead terminal (lead terminal 25) is arranged along a second side (other side: left side in FIG. 1) of the first radiator plate 31 that is opposite to the first side. Further, the third lead terminals (lead terminals 26 to 28) are arranged on the near side of the second radiator plate 32 along the side (second side) on which the second lead terminal is formed.

The first lead terminals (lead terminals 21 to 24) are connected to the first side of the first radiator plate 31 and function as extraction electrodes of a rear side electrode (D: drain electrode: one main electrode) of the power semiconductor chip 41 that is adhered to the upper surface of the first radiator plate 31. The second lead terminal (lead terminal 25) is connected to the bonding pad 411 serving as a source electrode (S: other main electrode). The third lead terminals (lead terminals 26 to 28) are connected to the electrodes (Vcc, GND, and FB) of the control IC chip 42. Both the second lead terminal and third lead terminals are formed separately from the first radiator plate 31. However, the lead terminal 27 is connected to the second radiator plate 32 and serves as a ground terminal.

As described above, in the power semiconductor module 10 of FIG. 1, the highest voltage is applied between the D and S (drain and source) of the power semiconductor chip 41. That is, during the circuit operation, the largest potential difference occurs between the first lead terminals (lead terminals 21 to 24) and the second lead terminal 25. Thus, in the power semiconductor module 10, the lead terminals 21 to 24 connected to the D terminals and the lead terminal 25 connected to the S terminal are arranged on the opposing sides across the first radiator plate 31. That is, the lead terminals between which a large potential difference occurs are arranged such that the lead terminals 21 to 24 are collectively arranged on the first side of the first radiator plate 31 and the lead terminal 25 is arranged on the second side of the first radiator plate 31. With this arrangement, the potential difference between the lead terminal 25 and its adjacent lead terminal 26 is sufficiently smaller than the potential difference between the lead terminal 25 and the lead terminals 21 to 24. As a result, in the power semiconductor module 10 of FIG. 1, it is possible to make the interval between the lead terminals between which a large potential difference occurs sufficiently wide, stably achieving high-voltage resistance.

Further, as shown in FIG. 1, the side a extending between the first and second sides of the first radiator plate 31 comes close to and opposite to the side c of the second radiator plate 32. The side b constituting the extending portion 31A of the first radiator plate 31 comes close to and opposite to the side d of the second radiator plate 32. The lead terminals 23 and 24 are connected to the first side of the extending portion 31A. A side e at the leading end of the extending portion 31A and a side f of the second radiator plate 32 that is opposite to the side c are substantially collinear with each other. With the above configuration, it is possible to increase the heat dissipation efficiency of the power semiconductor chip 41, as well as to allow the control IC chip 42 to accurately detect a temperature rise.

However, the side e at the leading end of the extending portion 31A need not be collinear with the side f of the second radiator plate 32. The extending portion 31A exhibits its effect as long as the extending portion 31A extends, in the direction along the first side (right side) of the first radiator plate 31, at least up to a position at which the side of the control IC chip 42 furthest away from the first radiator plate 31 exists and the extending portion 31A and the second radiator plate 32 are arranged with a gap interposed therebetween.

Heat from the power semiconductor chip 41 is released through the first radiator plate 31. Since the extending portion 31A is formed continuously from the first radiator plate 31 in the power semiconductor module 10 of FIG. 1, the heat generated in the power semiconductor chip 41 can efficiently be released outside through the first radiator plate 31. That is, the formation of the extending portion 31A increases the area of the first radiator plate 31 functioning as a heat sink of the power semiconductor chip 41. This allows transient heat from the power semiconductor chip 41 to be satisfactorily absorbed by the first radiator plate 31 and satisfactorily be released outside through the mold material and the like. Further, the first lead terminals (lead terminals 21 to 24) connected to the first radiator plate 31 extend outside from the mold material, thereby achieving a function of releasing the heat generated in the power semiconductor chip 41 to the outside. In particular, since the lead terminals 23 and 24 of the first lead terminals are connected to the extending portion 31A, heat transmitted to the extending portion 31A can also be released to the outside through the lead terminals. As a result, a semiconductor module excellent in heat radiation performance can be achieved.

In FIG. 1, a symmetrical configuration in terms of the lead terminals is adopted, in which the lead terminals are left-right symmetrically arranged and four lead terminals are formed on the right side. However, an asymmetrical configuration may be adopted in which the number of the lead terminals on the right side and the number of the lead terminals on the left side differ from each other. Further, in the case where a large number of the first lead terminals are formed, all the first lead terminals need not be connected to the first radiator plate 31.

Further, although the power semiconductor chip and the control IC chip are mounted on each of the first and second radiator plates in the above example, a chip (or chips) other than the power semiconductor chip and control IC chip may be mounted on each radiator plate. In this case, it is preferable that a chip generating a large amount of heat at operation time be mounted on the first radiator plate and a chip generating a small amount of heat be mounted on the second radiator plate.

What is claimed is:

1. A semiconductor device comprising:
a first radiator plate;
a second radiator plate disposed separately away from the first radiator plate;
a plurality of first lead terminals arranged on a first side of the first radiator plate and extending in a first direction from the first side;
a second lead terminal arranged on a second side of the first radiator plate that is opposite to the first side;
a third lead terminal arranged on the second side and located closer to the second radiator plate than the second lead terminal;
a power semiconductor chip mounted on a main surface of the first radiator plate and including a pair of main electrodes;
a control IC chip mounted on a main surface of the second radiator plate; and
a mold material covering the first radiator plate, the second radiator plate, a part of the first lead terminals, a part of the second lead terminal, a part of the third lead terminal, the power semiconductor chip, and the control IC chip,
the first lead terminals, second lead terminal and third lead terminals being led out from a pair of sides of the mold material in the opposite directions to each other, wherein
the first radiator plate has an extending portion arranged on a third side of the first radiator plate extending in a direction perpendicular to the first direction, at least up to a position at which a side of the control IC chip furthest away from the first radiator plate exists, and the extending portion and the second radiator plate are arranged with a gap interposed therebetween,
a temperature sensor is mounted on a part of the control IC chip close to the extending portion
all of the first lead terminals are connected to the first radiator plate,
one main electrode of the power semiconductor chip is connected to the first lead terminals, the other main electrode of the power semiconductor chip is connected to the second lead terminal, and an electrode of the control IC chip is connected to the third lead terminals.

2. The semiconductor device according to claim 1, wherein
the power semiconductor chip has one main electrode on its rear side and the other main electrode on its upper side,
the one main electrode is electrically connected to the first radiator plate, and the first lead terminals are connected to the first radiator plate to function as extraction electrodes of the one main electrode, and
the highest voltage among the voltage levels applied to a circuit constituted by the power semiconductor chip and the control IC chip is applied between the first lead terminals and the second lead terminal.

3. The semiconductor device according to claim 1, wherein
the first radiator plate including the extending portion has a larger thickness than those of the first lead terminals, second lead terminal, and third lead terminal.

* * * * *